(12) United States Patent
Iuchi et al.

(10) Patent No.: US 8,937,011 B2
(45) Date of Patent: Jan. 20, 2015

(54) METHOD OF FORMING CRACK FREE GAP FILL

(71) Applicant: SanDisk 3D LLC, Milpitas, CA (US)

(72) Inventors: Hiroaki Iuchi, Nagoya (JP); Hitomi Fujimoto, Yokkaichi (JP); Chao Feng Yeh, Yokkaichi (JP)

(73) Assignee: SanDisk 3D LLC, Milpitas, CA (US)

( * ) Notice: Subject to any disclaimer, the term of this patent is extended or adjusted under 35 U.S.C. 154(b) by 192 days.

(21) Appl. No.: 13/742,239

(22) Filed: Jan. 15, 2013

(65) Prior Publication Data

US 2014/0170847 A1 Jun. 19, 2014

Related U.S. Application Data

(60) Provisional application No. 61/738,878, filed on Dec. 18, 2012.

(51) Int. Cl.
*H01L 21/02* (2006.01)

(52) U.S. Cl.
CPC .............................. *H04L 21/02697* (2013.01)
USPC ............ 438/622; 438/634; 438/758; 438/778; 438/626; 438/633; 257/E21.585

(58) Field of Classification Search
USPC ......... 438/634, 622, 626, 631, 633, 758–763, 438/778, 787
See application file for complete search history.

(56) References Cited

U.S. PATENT DOCUMENTS

| 5,874,367 | A | 2/1999 | Dobson |
| 5,904,573 | A | 5/1999 | Jang et al. |
| 5,973,387 | A | 10/1999 | Chen et al. |
| 6,153,543 | A | 11/2000 | Chesire et al. |
| 6,177,286 | B1 | 1/2001 | Chidambarrao et al. |
| 6,232,658 | B1 | 5/2001 | Catabay et al. |
| 6,372,664 | B1 | 4/2002 | Jang et al. |
| 6,420,277 | B1 | 7/2002 | Catabay et al. |
| 6,426,285 | B1 | 7/2002 | Chen et al. |
| 6,828,255 | B2 | 12/2004 | Lai et al. |
| 7,422,985 | B2 * | 9/2008 | Dunton et al. ................. 438/740 |
| 7,935,643 | B2 | 5/2011 | Liang et al. |
| 8,008,187 | B2 * | 8/2011 | Dunton et al. ................. 438/634 |
| 8,802,561 | B1 * | 8/2014 | Yeh et al. ....................... 438/634 |
| 2006/0166514 | A1 | 7/2006 | Cheng et al. |
| 2011/0111137 | A1 | 5/2011 | Liang et al. |
| 2011/0151677 | A1 | 6/2011 | Wang et al. |

* cited by examiner

*Primary Examiner* — Savitr Mulpuri
(74) *Attorney, Agent, or Firm* — Vierra Magen Marcus LLP

(57) ABSTRACT

Techniques disclosed herein may achieve crack free filling of structures. A flowable film may substantially fill gaps in a structure and extend over a base in an open area adjacent to the structure. The top surface of the flowable film in the open area may slope down and may be lower than top surfaces of the structure. A capping layer having compressive stress may be formed over the flowable film. The bottom surface of the capping layer in the open area adjacent to the structure is lower than the top surfaces of the lines and may be formed on the downward slope of the flowable film. The flowable film is cured after forming the capping layer, which increases tensile stress of the flowable film. The compressive stress of the capping layer counteracts the tensile stress of the flowable film, which may prevent a crack from forming in the base.

21 Claims, 9 Drawing Sheets

US 8,937,011 B2

METHOD OF FORMING CRACK FREE GAP FILL

CLAIM OF PRIORITY

This application claims the benefit of U.S. Provisional Application No. 61/738,878 entitled, "Method of Forming Crack Free Gap Fill," filed on Dec. 18, 2012, which is incorporated herein by reference.

BACKGROUND

This disclosure relates to technology for forming semiconductor features.

Forming features in semiconductor circuits such as dense patterns of lines can present problems. Semiconductor device geometries continue to scale smaller and smaller, which presents even further difficulties. As the gaps between features become smaller and the aspect ratios of gap depth to width becomes greater it becomes harder to fill the gaps. For example, when filling a high aspect ratio gap the dielectric material may clog the top of the gap before it is filled. Therefore, a void may form.

Materials and techniques have been developed to prevent or reduce voids from forming due to the dielectric material clogging. For example, flowable dielectrics have been developed that work very well to fill narrow gap, high aspect ratio patterns. Some of these fill materials need a treatment, such as curing after deposition. The curing may outgas residual components, reduce the dielectric constant, complete formation of chemical bonds, etc. For example, a flowable CVD (Chemical Vapor Deposition) oxide may be treated with a high temperature steam anneal to convert the flowable CVD oxide to silicon oxide. Another technique for filling narrow gap, high aspect ratio patterns is a spin-on-dielectric (SOD). A SOD may be subjected to an ultraviolet radiation curing process.

DETAILED DESCRIPTION

Fabricating features in semiconductor circuits is disclosed herein. Techniques disclosed herein may achieve crack free filling of structures, which may have high aspect ratios and narrow gaps. In one embodiment, a structure having a pattern of lines and gaps is formed over a base. The structure is adjacent to an open area over the base. A flowable film (e.g., flowable CVD oxide film) is formed to substantially fill the gaps in the structure and over the base in the open area adjacent to the structure. The top surface of the flowable film in the open area may be lower than the top surfaces of the lines. Moreover, the top surface may have a downward slope to it in the open area. A capping layer (e.g., dielectric film) is formed over the flowable film. The capping layer has compressive stress in the horizontal direction. The bottom surface of the capping layer in the open area adjacent to the structure is lower than the top surfaces of the lines. The bottom surface may be formed on the downward slope of the flowable film. The flowable film is cured after forming the capping layer. The curing increases tensile stress of the flowable film in the open area in the horizontal direction. The compressive stress of the capping layer in the horizontal direction counteracts the tensile stress of the flowable film in the horizontal direction. In one embodiment, the capping layer has a compressive stress in the horizontal direction that counteracts the tensile stress of the cured flowable film in the horizontal direction to prevent a crack from forming in the base as a result of a void where the flowable film failed to fill a gap in the structure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed over," or "formed above" another element or layer, it can be directly or indirectly formed over or above the other element or layer. That is, intervening elements or layers may be present. In contrast, when an element or layer is referred to as being "directly formed on," another element, there are no intervening elements or layers present.

Figure 1A:
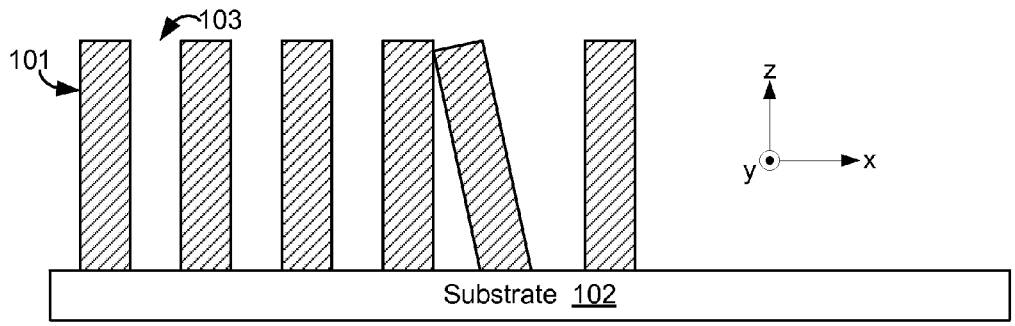
FIG. 1A shows a pattern of lines and gaps over a substrate.

FIG. 1A shows a pattern of lines 101 and gaps 103 over a substrate 102. The pattern may be used to form features in a semiconductor circuit, for example. The substrate 102 could be one of many materials, including but not limited to, an insulator, monocrystalline silicon, etc. The lines 101 could be metal, polysilicon, or some other material. The lines 101 could be some combination of materials. For example, the lines could have been formed from two or more layers of materials. However, the lines 101 could also be formed from one layer of the same material. The lines extend in the y-direction and may include one or more materials in the y-direction. This pattern could be a high aspect ratio structure. Filling the gaps 103 in a high aspect ratio pattern can be difficult and can present problems.

Structures such as the one depicted in FIG. 1A may have some pattern collapse or line bending. In this example, one of the lines 101 has collapsed, such that it is leaning against another line 101. As will be described below, the pattern collapse can lead to other problems.

Figure 1B:
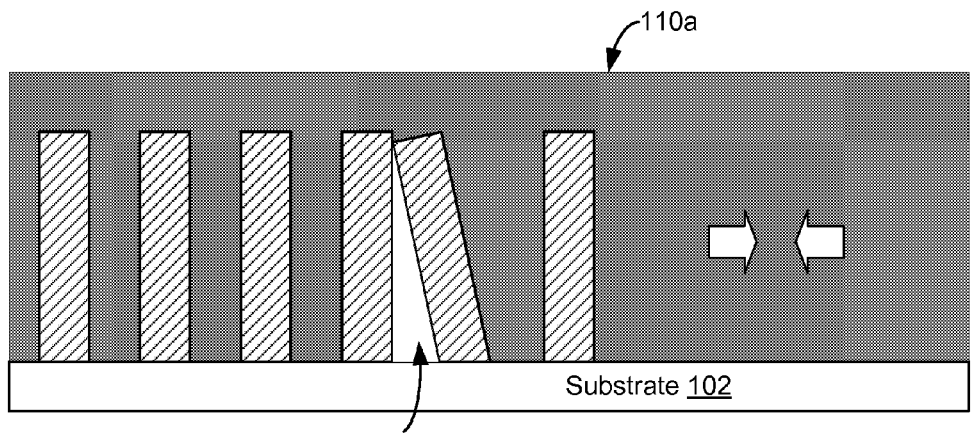
FIG. 1B shows a void in the pattern when a dielectric material is used to fill the gaps in the structure of FIG. 1A.
Figure 1C:
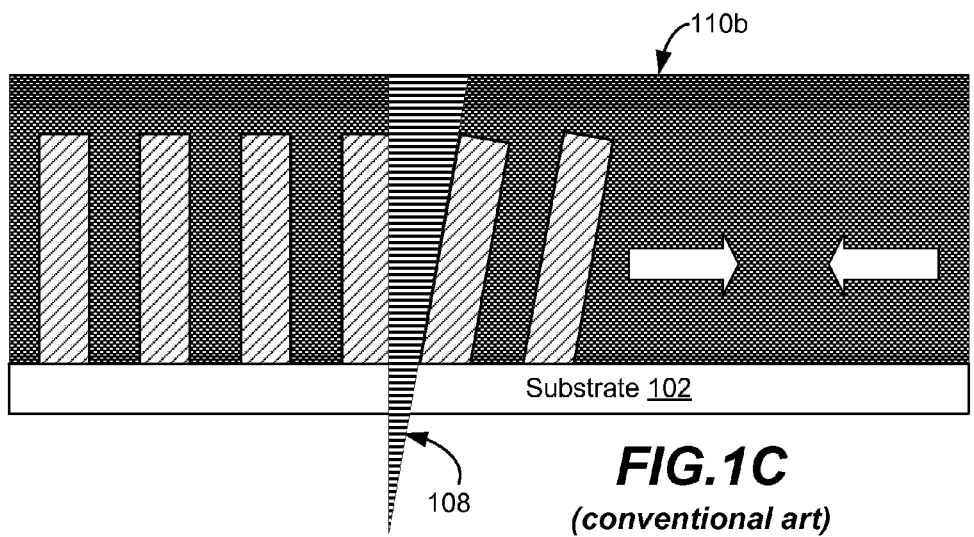
FIG. 1C shows a crack that may form in the substrate when using a conventional process to fill the pattern of FIG. 1A.

It may be desirable to fill the structure with a material such as a dielectric. An example dielectric is silicon oxide. Forming the dielectric may include a fill stage, as depicted in FIG. 1B, and a cure stage, which is represented in FIG. 1C. FIG. 1B shows what may happen when a fill material 110a is formed to fill the gaps 103 in the structure of FIG. 1A. The fill material 110a could be a flowable oxide. Ideally, the flowable oxide will completely fill the gaps 103 in the pattern. However, the line collapse may result in a void 106 that the fill material 110a does not fill. In this example, the void 106 is between the collapsed line and its neighbor. Note that even if the fill material 110a is in general very effective at gap filling a void may still occur in situations such as the line collapse and other situations.

As noted, some fill material 110a materials need to be treated after being deposited. For example, a steam anneal might be performed after depositing a flowable CVD (Chemical Vapor Deposition) oxide to convert it to silicon oxide. The steam anneal may increase the tensile stress of the flowable CVD oxide. As another example, a spin-on-dielectric (SOD) might undergo an ultraviolet curing process.

Note that the fill material 110a may shrink as a result of the curing process. There may be more shrinkage in the open area adjacent to the structure than in the gaps in the structure.

Also, the tensile stress of the flowable CVD oxide, SOD, or other material may increase as a result of the curing treatment. Tensile stress is represented in FIG. 1B by the two arrows pointing towards each other. This tensile stress has a component that is horizontal to the substrate 102. Tensile stress is also represented in FIG. 1C by the two arrows pointed at each other. The length of the arrows is longer in FIG. 1C to represent that the tensile stress has increased as a result of treating the fill material 110a. Note that these arrows represent the tensile stress in the open area adjacent to the pattern. As noted, this tensile stress may have a component that is horizontal to the substrate 102.

This tensile stress in the open area adjacent to the structure can induce a crack in the substrate 102. A possible reason for the crack in the substrate 102 is due to the void 106. The tensile stress in the open area adjacent to the structure may pull the pattern. This is represented by two of the lines leaning to the right. Note that the void 106 may exacerbate this problem. This can result in a crack 108 forming. The crack 108 may not only impact the fill layer/structure region, but could also crack the substrate 102.

Also, note that the tensile stress (if any) prior to treatment may not be sufficient to crack the substrate 102, even if there is a void 106. However, the crack may result due to the total magnitude of the tensile stress after treatment. If there were no void 106, it may be that the substrate 102 would not crack even with the increased tensile stress. However, a void is not required for a crack to form in the substrate 102.

Semiconductors are often fabricated with many different layers. Thus, a pattern of lines is not necessarily fabricated directly on a substrate 102. Instead, the pattern of lines might be formed directly on a layer that may comprise, for example, metal lines interspersed with dielectric. In such a case, the problem of cracking can still occur. In this case, the layer just below the pattern of lines can crack. In some cases, the crack may extend through this lower layer all of the way into the substrate.

Figure 2:
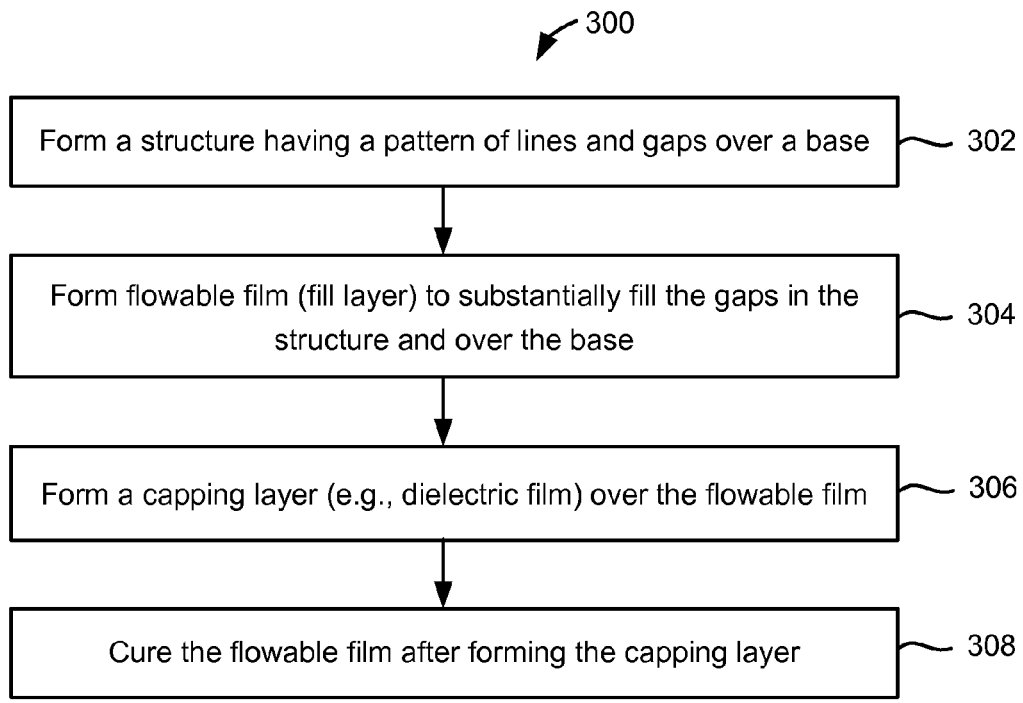
FIG. 2 is a flowchart of steps of one embodiment of a process of filing a structure having a pattern of lines and gaps (e.g., gap filling).
Figure 3A:
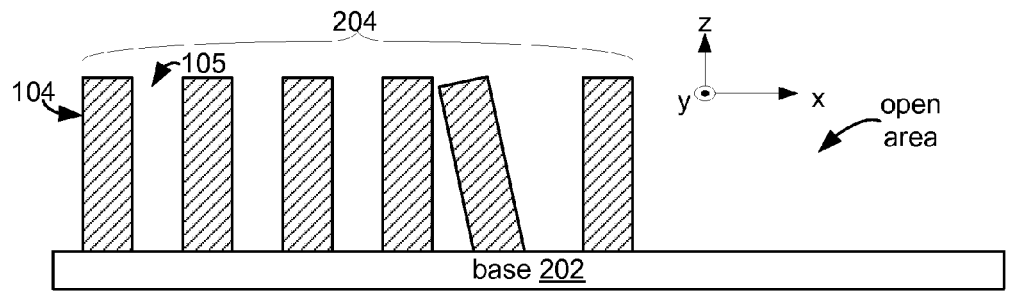
FIGS. 3A, 3B, 3C, and 3D show results after various steps the process of FIG. 2.

FIG. 2 is a flowchart of steps of one embodiment of a process 300 of filing a structure having a pattern of lines and gaps (e.g., gap filling). FIGS. 3A-3D show results after various steps of the process 300, in accordance with embodiments. In step 302, a structure having a pattern of lines and gaps is formed over a base 202. FIG. 3A shows results after one embodiment of step 302. FIG. 3A shows a structure 204 having a pattern of lines 104 and gaps 105 over a base 202. The base 202 could be a substrate, such as monocrystalline silicon, IV-IV compounds such as silicon-germanium or silicon carbon, III-V compounds, II-VII compounds, etc. However, the base 202 could be some layer above a substrate. The base 202 could be an epitaxial layer over a substrate. The base 202 could be a layer that includes metal lines and dielectric material that is formed above a substrate.

There is an open area over the base 202 adjacent to the structure 204. As noted earlier, an open area adjacent to a structure 204 being filled can potentially have an impact on structural integrity of the structure and base.

One of the lines 104 has collapsed and is leaning against its neighbor. It is not required that a line 104 has collapsed, but this is depicted for purposes of explanation. In one embodiment, the lines 104 are used to form memory cells in a 3D memory array, as well as conductors (e.g., bit lines or word lines). For example, a single line 104 may be used to form one conductor in the y-direction and multiple memory cells. Note that the lines may be etched in the x-direction to form individual memory cells from one of the lines. In the example of a 3D memory array, the open area may be a region adjacent to an array of memory cells. However, note that the structure 204 is not limited to use in a 3D memory array.

An example height for the structure 204 is about $3.5 \times 10^{-7}$ meters (about 350 nm). An example line width is $3 \times 10^{-8}$ meters or less (30 nm or less). Thus, the aspect ratio could be greater than 10. The structure 204 could be taller or shorter than 350 nm. The lines could be wider or narrower than 30 nm. The aspect ratio could be greater than 10 or less than 10. The open area adjacent to the structure 204 could be about $1 \times 10^{-7}$ to $1 \times 10^{-4}$ meters (100 nm-100 μm), as an example range. In one embodiment, the open area extends at least $1 \times 10^{-6}$ meters (1 μm) away from the structure 204.

Figure 3B:
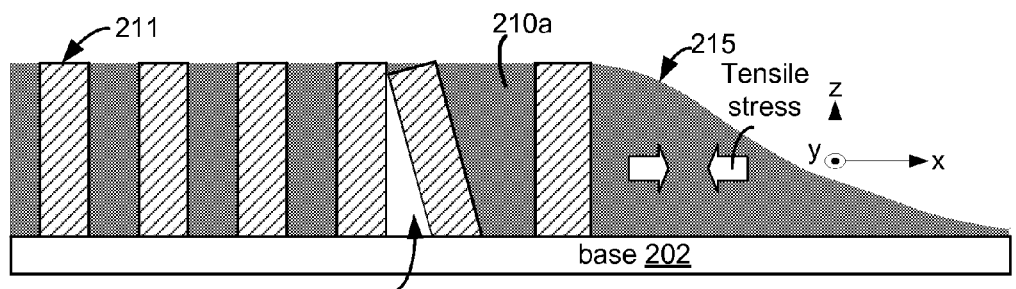

In step 304, a flowable film is formed to substantially fill the gaps 105 in the structure 204. By substantially filling the gaps 105 it is meant that there may be some voids where the flowable film does not completely fill the gaps. Also, it may be that the flowable film does not completely reach to the top of each gap 105. The flowable film is also formed over the base 202 in the open area adjacent to the structure 204. FIG. 3B shows results after one embodiment of step 304. A flowable film has been deposited and substantially fills the open gaps 105 in the structure 205. The flowable film forms a fill layer 210a. There may be a void 106 in the fill layer 210a. In this example, the void 106 results due to the collapse of the line pattern. However, a void could result for other reason. The fill layer 210a has approximately the minimum thickness within the structure 204 to reach the top surfaces of the structure 204, in one embodiment. One of the top surfaces 211 of a line 104 is pointed out in FIG. 3A. The fill layer 210a has a top surface 215 outside of the structure 204 that is lower than the top surfaces 211 of the lines 104. In one embodiment, the top surface 215 of the flowable film slopes downward moving away from the structure 204. Note that there may be a downward slope to this surface 215. In one embodiment, the downwards slope results due to surface tension.

In one embodiment, the flowable film is a flowable oxide film. This may be a flowable CVD oxide film. In one embodiment, the flowable film is a flowable spin on dielectric (SOD). In one embodiment, the flowable film is PSZ (polysilazane). The flowable film could be a different type of SOD. In one embodiment, the flowable film is carbon free. The composition of the flowable film may be $Si_xN_yH_z(O)$. In one embodiment, the flowable film does include carbon. For example, the composition of the flowable film may include silicon, oxygen, carbon, and hydrogen.

When deposited, the flowable film may have a relatively small tensile stress. Tensile stress, which may have a component that is horizontal (e.g., x-direction) to the base 202, is represented in FIG. 3B by the two arrows pointing towards each other. Thus, there may be some tensile stress in the open area adjacent to the structure 204. The relatively small tensile stress is typically not strong enough to cause a problem of cracking the base 202. As one example, the tensile stress may be less than 150 MPa. It may be that there is no tensile stress in the flowable film at this point. Thus, the tensile stress might be between 0 MPa and 150 MPa. Note that these are just example values for the tensile stress.

Figure 3C:
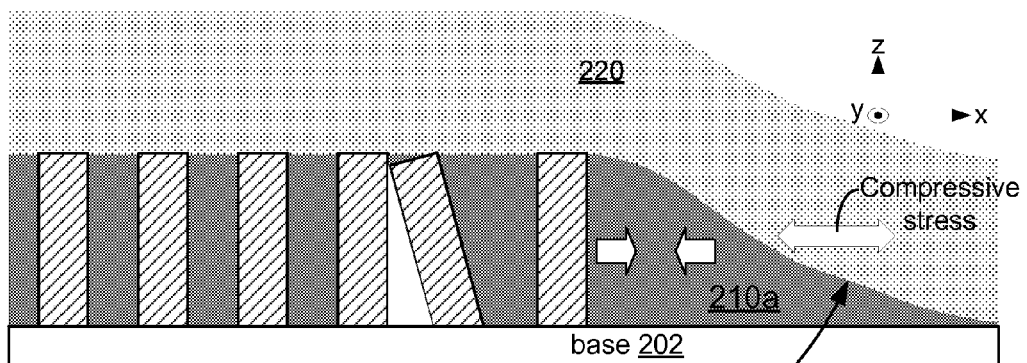

In step 306, a capping layer (e.g., dielectric film) is formed over the flowable film. FIG. 3C depicts results after step 306. The capping layer 220 covers the fill layer 210a over the structure 204 and over the open area adjacent to the structure 204. The capping layer 220 has a bottom surface 231 that may be in contact with the top surface 215 of the fill layer 210a, in one embodiment. The bottom surface 231 is lower than the top surfaces 211 of the lines 205. In one embodiment, a portion of the capping layer 220 is formed on the downward slope of the flowable film 210. This may be formed directly on the downward slope of the flowable film 210. Alternatively, it may be formed indirectly on the downward slope of the flowable film 210.

The capping layer 220 may have compressive stress. Compressive stress having a component that is along the x-axis (e.g., parallel to the base 202) is represented by the double-sided arrow in FIG. 3C. This compressive stress may counteract the tensile stress of the flowable film in the fill layer 210a.

As one example, it might be that a net stress of about +150 MPa adjacent to the structure 204 would present a substantial risk of cracking the base 202. Note that a greater or lower magnitude of tensile stress might present such a substantial risk. If the tensile stress after depositing the flowable film is less than this, then a substantial risk of cracking the base 202 may be avoided. After depositing the capping layer, the compressive stress may counteract the tensile stress. As one example, the compressive stress may be about −100 to −150 MPa. Thus, in absolute magnitude this could be less than or greater than the initial tensile stress of the flowable film. However, there should not be a substantial risk of cracking the base 202.

In one embodiment, the thickness of the capping layer 220 depends on the thickness of the fill layer 210. In one embodiment, the capping layer 220 is thicker than the fill layer 210. However, the capping layer 220 could be thinner than the fill layer 210. Here, the thickness of the fill layer 210 refers to the thickness in the region of the structure 204. Similarly, the thickness of the capping layer 220 refers to the thickness above the structure 204

In one embodiment, the capping layer 220 is formed from a flowable CVD oxide film. In one embodiment, the capping layer 220 is formed using PE-CVD (Plasma Enhanced CVD). In one embodiment, the capping layer 220 is a silicon oxide layer formed using PE-CVD. This may be referred to as a PE-TEOS silicon oxide layer. In one embodiment, the capping layer 220 is a layer of silicon oxide formed using PE-CVD with tetraethylorthosilicate (TEOS) as a source. As one example, a silicon oxide PE-TEOS capping layer 220 may be formed with a temperature over 300 C, a pressure between 3-10 Torr, 13.56 MHz RF and 300-400 Hz LF plasma, and $O_2$ gas may be used as a oxidation gas.

In one embodiment, the capping layer 220 is a silicon nitride layer formed using PE-CVD. As one example, a silicon nitride PE-CVD capping layer 220 may be formed with a temperature between 350-450 degrees C. and a pressure between 3-10 Torr. An RF power of more than 100 W may be used.

In one embodiment, the capping layer 220 is a silicon oxide layer formed using HDP-CVD. As one example, a silicon oxide HDP-CVD capping layer 220 may be formed with a temperature over 200 C and a pressure under 1 Torr. $SiH_4$, $O_2$ may be used. Ar, He or $H_2$ may be added to optimize the process.

In one embodiment, a bias power is used to achieve compressive stress in the capping layer 220.

The foregoing process parameters are examples. The capping layer 220 could be formed from other materials and/or using other processes. All process parameters could be higher or lower than those specified.

Figure 3D:
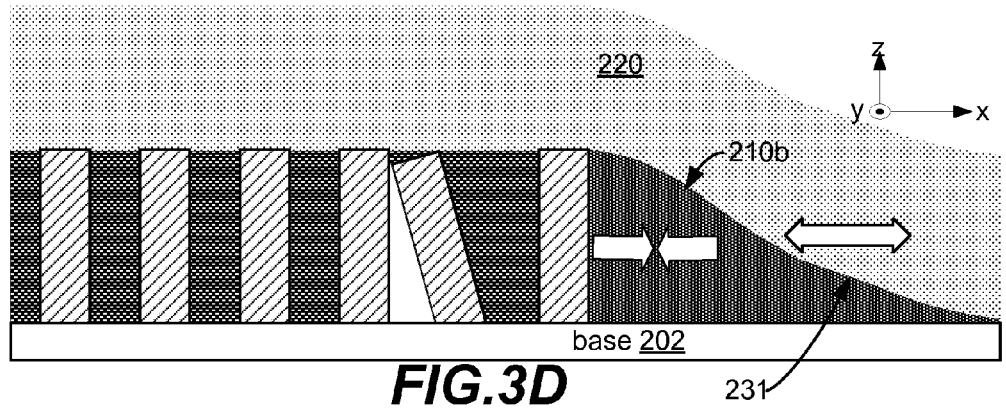

In step 308, the flowable film is cured. In one embodiment, the flowable film is converted to silicon oxide. Reference numeral 210a is used to represent the fill layer prior to curing the flowable film. Reference numeral 210b is used to represent the fill layer after curing the flowable film (e.g., converting to silicon oxide). Note that this step is performed after forming the capping layer 220 having compressive stress. FIG. 3D depicts results after step 308.

Curing the flowable film (e.g., converting the flowable film to silicon oxide) may increase the tensile stress. This is represented in FIG. 3D by the increased length of the arrows. However, the compressive stress of the capping layer 220 in the open area counteracts the tensile stress of the fill layer 210b in the open area after conversion. For example, the x-axis component of the compressive stress of the capping layer 220 counteracts the x-axis component of the tensile stress of the fill layer 210 after conversion to silicon oxide. In one embodiment, the capping layer 220 (e.g., dielectric film) has a compressive stress in the horizontal direction in the open area that counteracts the tensile stress of the flowable film in the horizontal direction in the open area after the flowable film is cured (e.g., converted to silicon oxide) to prevent a crack from forming in the base 202 as a result of a void 106 where the flowable film failed to fill a gap 105 in the structure 204.

As one example, the tensile stress of the flowable film of the fill layer 210 may be about +230 MPa after is it is cured (e.g., converted to silicon oxide). If there were no capping layer 220 having compressive stress to counteract the tensile stress, then there may be a substantial risk of cracking the base (e.g., if there is a void). The compressive stress of the capping layer 220 may be about −100 to −150 MPa. Thus, the compressive stress of the capping layer 220 may substantially balance the tensile stress of the fill layer 210b after curing. It is not required that the compressive stress of the capping layer 220 completely balance the tensile stress of the fill layer 210b after curing. That is, it is not required that the compressive stress be equal (but opposite) the tensile stress. In the foregoing example, the absolute magnitude of the compressive stress is less than the absolute magnitude of the tensile stress. However, the absolute magnitude could be greater.

In one embodiment, step 308 includes performing a high temperature steam anneal. For example, a flowable CVD oxide film that comprises $Si_xN_yH_z(O)$ may be converted to silicon oxide by performing a steam anneal.

In one embodiment, step 308 includes exposing the materials being formed to ultraviolet radiation. For example, the structure of FIG. 3C may be exposed to ultraviolet radiation, which may cure the flowable film. This may be used when the flowable film is a SOD, but is not so limited.

Figure 4:
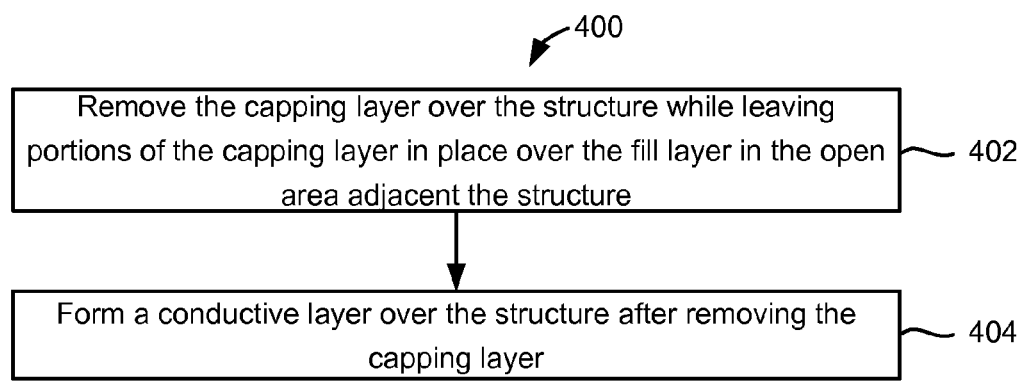
FIG. 4 is a flowchart of one embodiment of a process of removing portions of a capping layer.
Figure 5A:
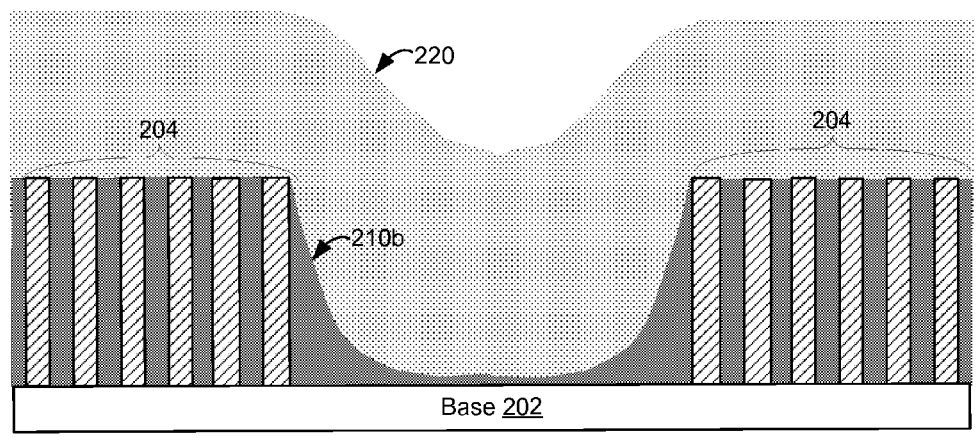
FIGS. 5A, 5B, and 5C show results after various steps the process of FIG. 4.
Figure 5B:
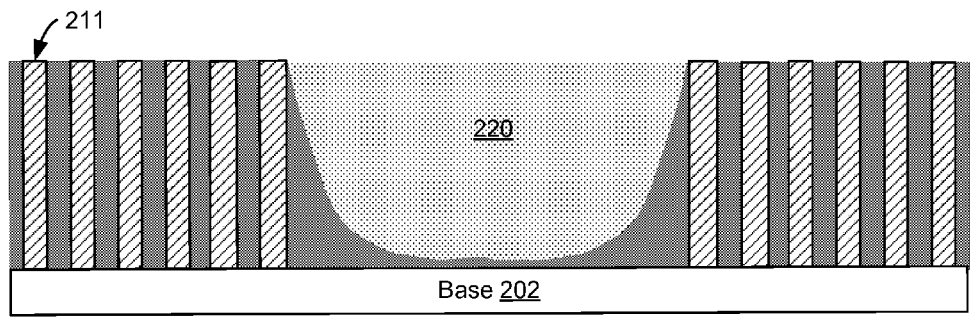
Figure 5C:
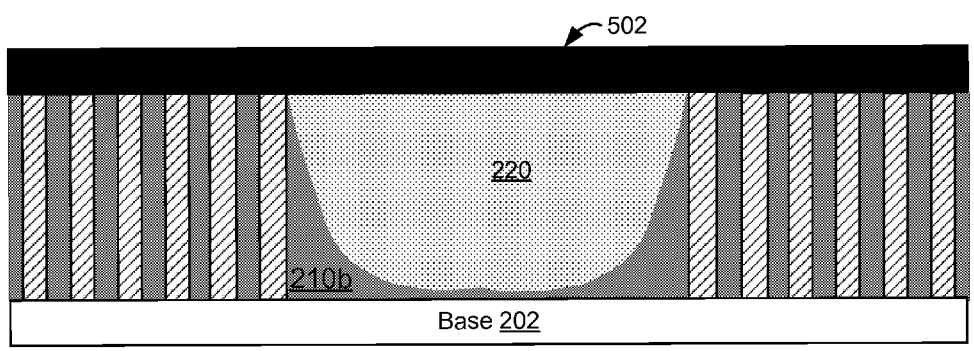

In one embodiment, portions of the capping layer 220 are removed such that another layer may be formed over, and possibly in contact with, the structure 204. FIG. 4 is a flowchart of one embodiment of a process of removing portions of the capping layer. FIGS. 5A-5C will be used to illustrate. FIG. 5A shows elements that can be formed using the process of FIG. 2 prior to the process of FIG. 4. FIG. 5A shows two structures 204, each having a pattern of lines and gaps. The structures 204 have been filled with a fill layer 210. A capping layer 220 is formed over the fill layer 210. The fill layer 210b has been cured (e.g., converted to silicon oxide). There was an open area between the two structures 204 that is now filled with portions of the fill layer 210b and the capping layer 220. Note that even though the open area is now filled, for purpose of discussion of this and other examples, it will still be referred to as the open area adjacent to the structure 204. In this example, neither structure 204 has a collapsed line. However, either or both structures 204 could have one or more collapsed lines.

In step 402, portions of the capping layer 220 are removed over the structures 204, while leaving portions of the capping layer 220 in place over the fill layer 210 in the open area between the structures 204. FIG. 5B depicts results after step 402. In one embodiment, the capping layer 220 is planarized (e.g., CMP). Thus, the capping layer 220 may be completely removed directly above the structures 204. The capping layer 220 may be planarized such that its top surface is level with the top surfaces 211 of the lines.

In step 404, a conductive layer is formed over the top of the structure 204 after removing the capping layer 220. FIG. 5C depicts results after step 404, showing a conductive layer 502 over the top surfaces 211 of the lines of the structures. In one embodiment, the conductive layer 502 is in direct contact with the top surfaces 211 of the lines. However, an intermediate layer, such as an adhesion layer, may be between the conductive layer 502 and the structure 204. However, the conductive layer 502 may still be in electrical contact with the top surfaces 211 with or without an intermediate layer.

Note that after process 400 portions of the capping layer 220 still exist to provide a compressive stress to counteract tensile stress of the fill layer 210 adjacent to the structures 204. Therefore, cracking of the base 202 may be reduced or prevented.

Figure 6A:
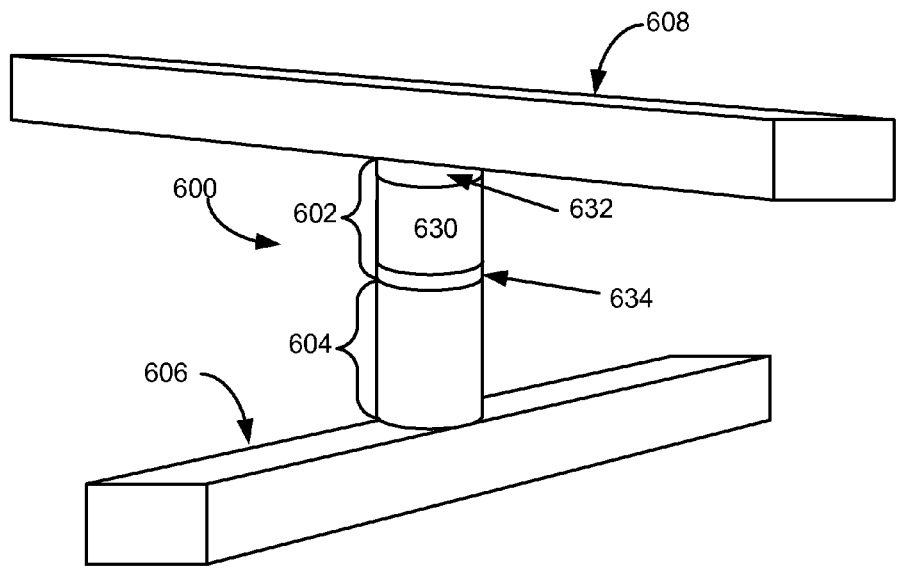
FIG. 6A is a simplified perspective view of one embodiment of a memory cell which includes a reversible resistivity-switching element coupled in series with a steering element.

In one embodiment, portions of a 3D memory array are formed. The 3D memory array may have reversible resistivity-switching element memory cells. Sometimes such memory cells are referred to as ReRAM. Prior to discussing forming a memory array, an example memory cell and memory arrays will be discussed. FIG. 6A is a simplified perspective view of one embodiment of a memory cell 600 which includes a reversible resistivity-switching element 602 coupled in series with a steering element 604. The memory cell is between a first conductor 606 and a second conductor 608. The first and second conductors 606, 608 may be referred to as a bit line and a word line, or as an x-conductor and a y-conductor.

Reversible resistivity-switching element 602 includes reversible resistivity-switching material 630 having a resistance that may be reversibly switched between two or more states. For example, the reversible resistivity-switching material may be in an initial high-resistance state upon fabrication that is switchable to a low-resistance state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used.

In one embodiment, the process of switching the resistance from the high-resistance state to the low-resistance state is referred to as SETTING the reversible resistivity-switching element 602. The process of switching the resistance from the low-resistance state to the high-resistance state is referred to as RESETTING the reversible resistivity-switching element 602. The high-resistance state may be associated with binary data "0" and the low-resistance state is associated with binary data "1." In other embodiments, SETTING and RESETTING and/or the data encoding can be reversed.

In some embodiments, reversible resistivity-switching material 630 may be formed from a metal oxide. Various different metal oxides can be used. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Reversible resistivity-switching element 602 includes electrodes 632 and 634. Electrode 632 is positioned between reversible resistivity-switching material 630 and conductor 608. In one embodiment, electrode 632 is made of TiN. Electrode 634 is positioned between reversible resistivity-switching material 630 and diode 604. In one embodiment, electrode 634 is made of Titanium Nitride.

Conductors 606 and 608 may include any suitable conductive material such as tungsten, any appropriate metal, heavily-doped semiconductor material, a conductive silicide, a conductive silicide-germanide, a conductive germanide, or the like. In the embodiment of FIG. 6A, conductors 606 and 608 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 606 and 608 to improve device performance and/or aid in device fabrication.

Figure 6B:
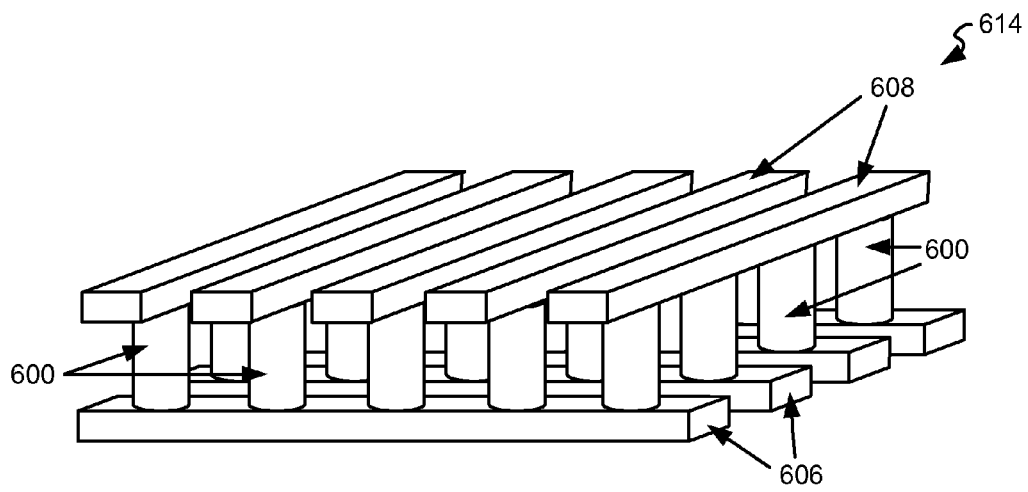
FIG. 6B is a simplified perspective view of a portion of a first memory level formed from a plurality of the memory cells of FIG. 6A.

FIG. 6B is a simplified perspective view of a portion of a first memory level 614 formed from a plurality of the memory cells 600 of FIG. 6A. For simplicity, the reversible resistivity-switching element 602 and the steering element 604 are not separately shown. The memory array 614 is a "cross-point" array including a plurality of first conductors 606 (e.g., bit lines) and a plurality of second conductors 608 (e.g., word lines) between which multiple memory cells are coupled (as shown). Other memory array configurations may be used, as may multiple levels of memory.

Figure 6C:
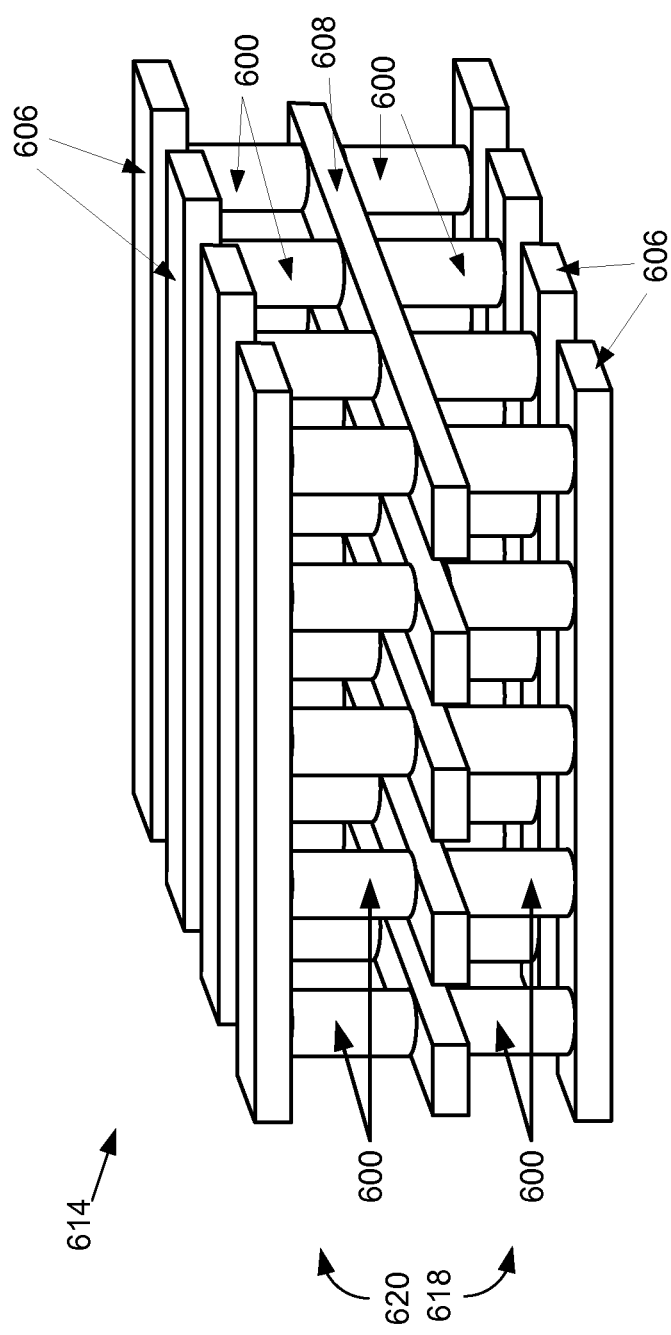
FIG. 6C is a simplified perspective view of a portion of a monolithic three-dimensional array that includes a first memory level positioned below a second memory level.

FIG. 6C is a simplified perspective view of a portion of a monolithic three-dimensional array 616 that includes a first memory level 618 positioned below a second memory level 620. In the embodiment of FIG. 6C, each memory level 618 and 620 includes a plurality of memory cells 600 in a cross-point array. Other memory array configurations may be used, as may additional levels of memory.

FIGS. 6A-6C show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material.

Figure 7:
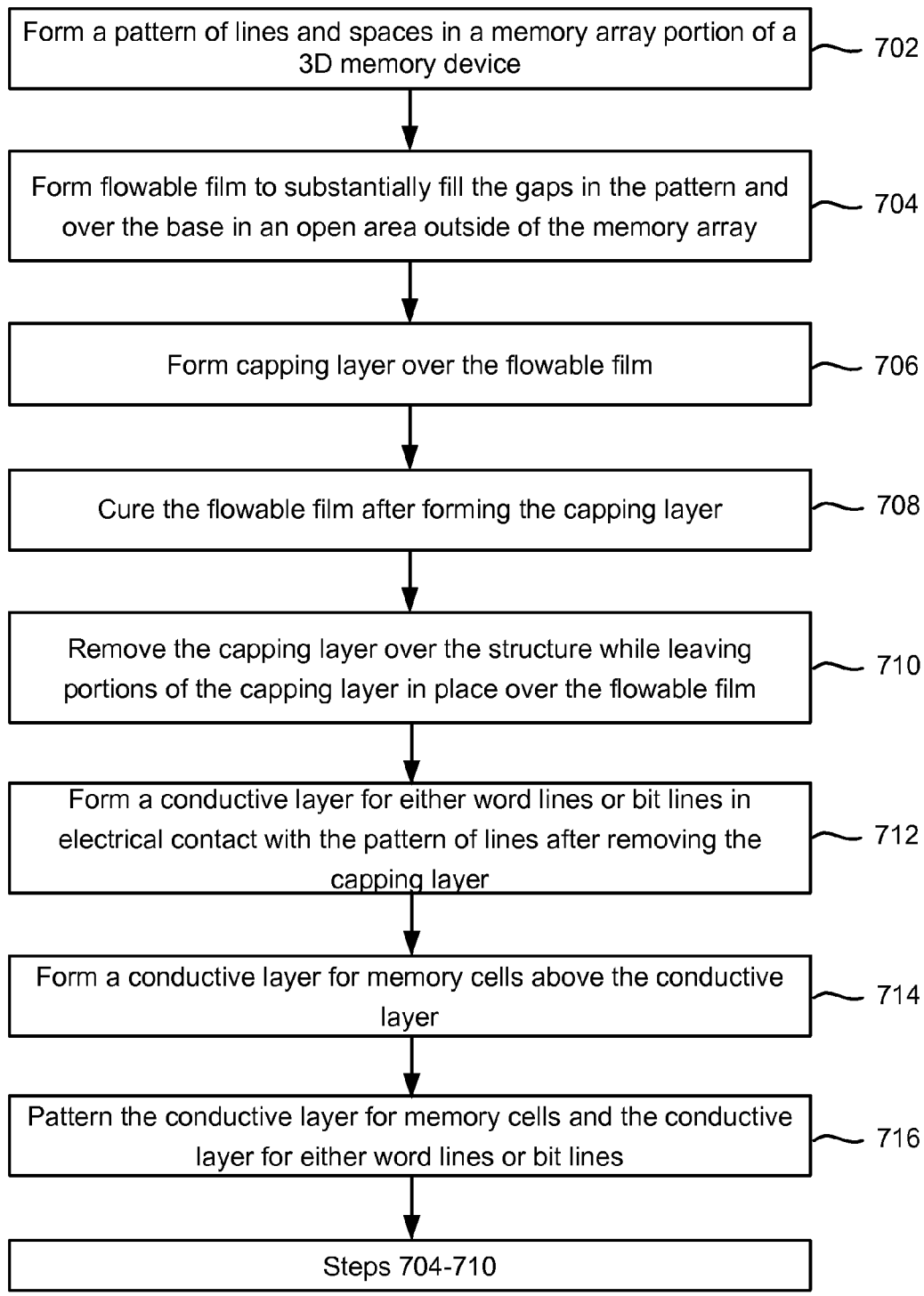
FIG. 7 is a flowchart of one embodiment of a process of forming portions of a 3D memory array.

FIG. 7 is a flowchart of one embodiment of a process 700 of forming portions of a 3D memory array. The process 700 may be used to form memory arrays such as those depicted in FIGS. 6B and 6C, but is not limited to those memory arrays. Process 700 includes forming a capping layer having compressive stress over a fill layer having tensile stress. The compressive stress may counteract the tensile stress adjacent to the memory array to prevent a crack from forming in a substrate. FIGS. 8A-8D show results after various steps of the process of FIG. 7. Various steps in process 700 are embodiments of steps in the processes of FIG. 2 and FIG. 4.

In step 702, a pattern of lines and gaps is formed for a memory array portion of a 3D memory device. This pattern may be the basis for conductive lines (e.g., bit lines or word lines) and memory cells. This pattern may be formed over a base 202. Step 702 is one embodiment of step 302.

In step 704, a fill layer (e.g., flowable film) is deposited to substantially fill the gaps in the pattern. The flowable film also extends over a portion of the base (e.g., substrate) adjacent to the structure. For example, the flowable film may cover a portion of the base adjacent to the memory array. Step 704 is one embodiment of step 304.

In step 706, a capping layer (e.g., dielectric film) is formed over the flowable film. Step 706 is one embodiment of step 306. In step 708, the flowable film is cured (e.g., converted to silicon oxide) after depositing the capping layer. Step 708 is one embodiment of step 308.

In step 710, the capping layer is removed over the structure, while leaving portions of the capping layer in place adjacent to the memory array. The capping layer may be planarized using CMP. Step 710 is one embodiment of step 402.

Figure 8A:
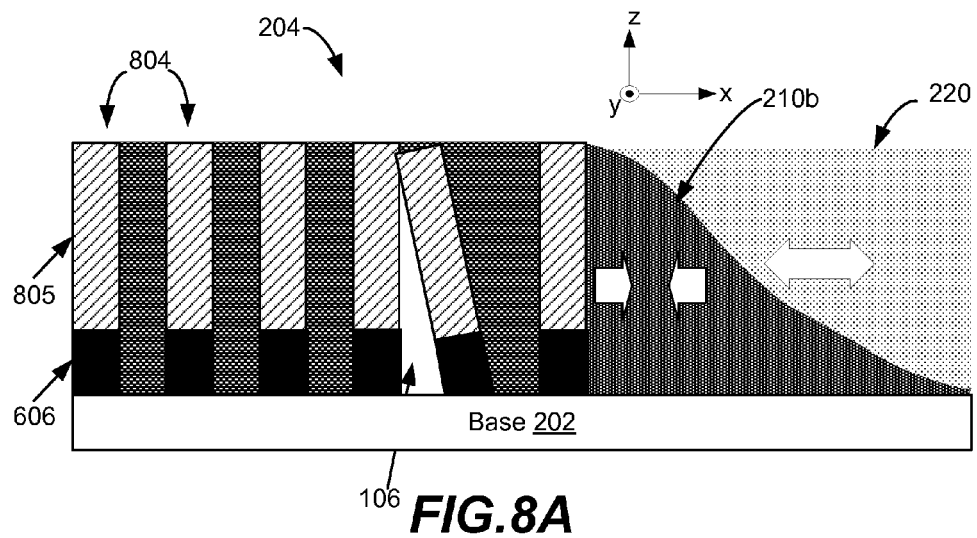
FIGS. 8A, 8B, 8C, and 8D show results after various steps of the process of FIG. 7.

FIG. 8A depicts results after step 710. The lines 804 in FIG. 8A will be used for y-conductors and memory cells above the y-conductors. Referring back to FIG. 6C, these lines may be used for the lowest level of conductors 606 that extend in the y-direction and for the memory cells 600 just above. At this point no cut has been made in the x-direction. Hence the lines extend in the y-direction at this time. A portion of a y-conductor 606 is referenced at the bottom of one of the lines. A "memory cell" line 805, which will be used to form many memory cells after etching in the x-direction is depicted.

The gaps between the lines 804 have been substantially filled with the flowable film 210b (which has been cured as of this step). However, there may be a void 106 where a line 804 has collapsed. The void 106 is not a requirement. The capping layer 220 is shown over the cured flowable film 210b in the open area adjacent to the structure. The capping layer 220 is formed over the downward slope of the flowable film 210b. This may be directly or indirectly on the flowable film 210b. Note that this structure may be a portion of a memory array. Hence, this open area may be adjacent to a memory array. In one embodiment, the compressive stress of the capping layer 220 in the horizontal direction substantially balances the tensile stress of the cured flowable film 210b in the horizontal direction in the open area outside of the memory array. This be prevent or reduce cracks in the base 202

In step 712, a conductive layer for either word lines or bit lines is formed over the pattern of lines. This conductive layer may be in direct contact with the structure 204, but that is not a requirement. In one embodiment, there is an intermediate layer between the conductive layer and the structure 204. Step 712 is one embodiment of step 404 from FIG. 4.

Figure 8B:
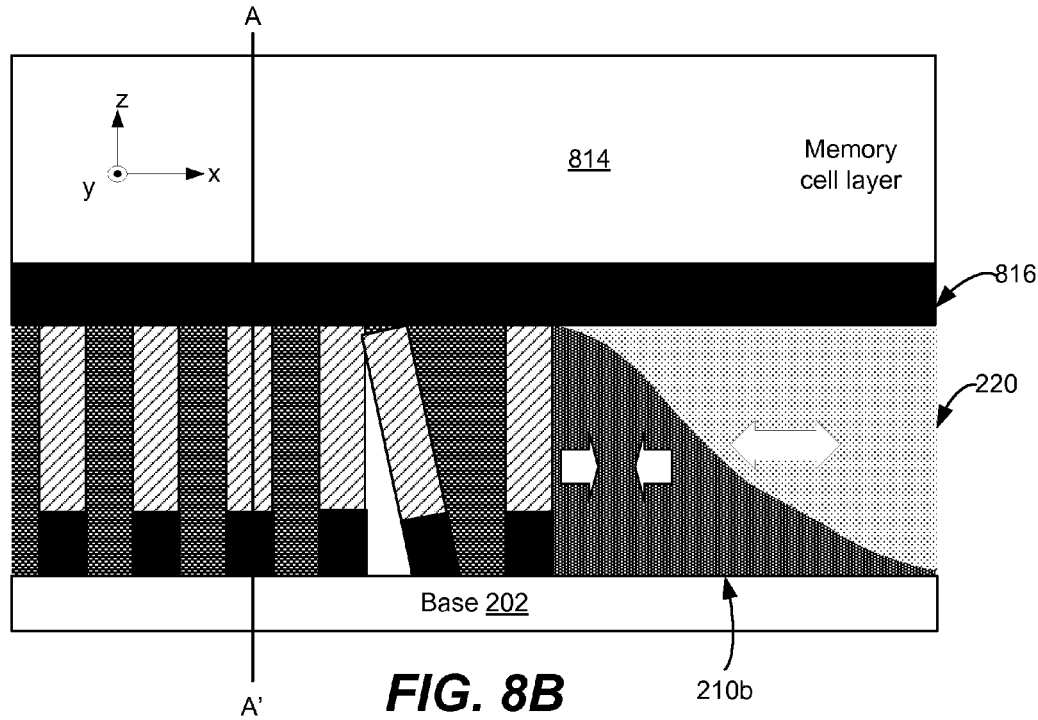

In step 714, a layer for memory cells is formed over the conductive layer. This layer may have many different sub-layers. FIG. 8B depicts results after one embodiment of step 714. FIG. 8B shows a conductive layer 816 over the structure 204, as well as a memory cells layer 814. As shown in FIG. 6A, the memory cell may have numerous different materials. Thus, one or more layers could be formed for the steering element 604, and several layers for the switching element 602.

Figure 8C:
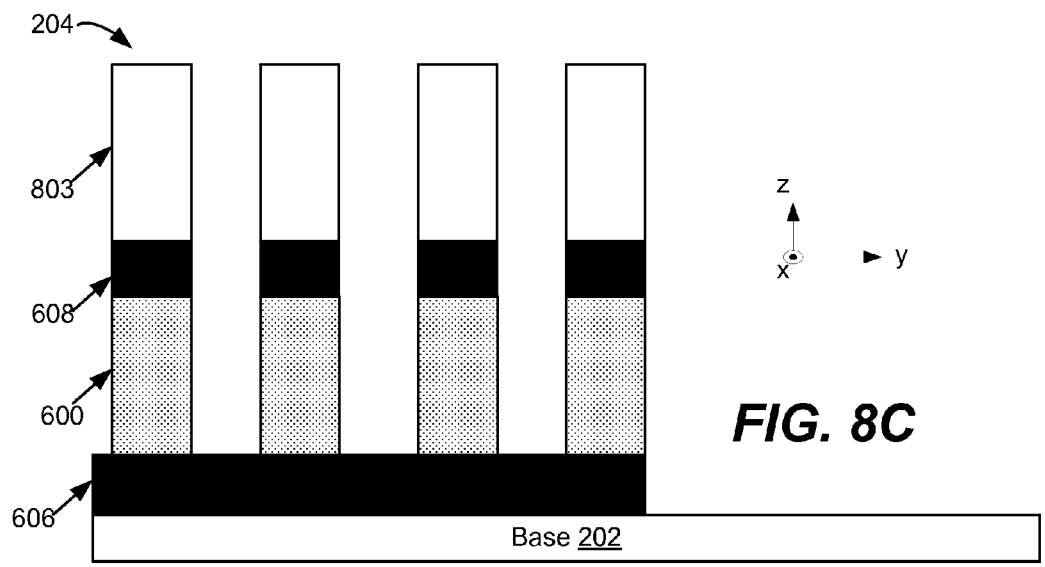

In step 716 the conductive layer and memory cell layer are patterned and etched. FIG. 8C depicts results after one embodiment of step 716. FIG. 8C depicts a cross section of structure of FIG. 8B along reference line A-A'. FIG. 8C shows an yz-plane perspective. From this perspective, a lower conductive line 606 is seen above the base 202. This conductive line extends in the y-direction. A lower layer of memory cells 600 are shown. These may correspond to the lower layer 618 in FIG. 6C. Above that are conductive lines 608. These conductive lines extend in the x-direction. Above that are lines 803 that will be used to form an upper layer of memory cells. Further etching (in the y-direction) may be used to form the memory cells from region 803.

Note that in this example, a structure 204 having a dense pattern of lines is formed from many different materials. The etching from step 716 formed lines from the memory cell layer (FIG. 8B, 814) and conductive layer (FIG. 8B, 816) shown in FIG. 8B. The etching from step 716 also etched below that to form the lower memory cells 600 from the lines. Referring back to FIG. 8B, it can be seen that this portion of the line that extends in the x-direction has alternating memory cell portions and fill layer portions. Thus, the dense pattern of lines to be filled can be quite complex. In the example of FIG. 8C, there is an open area adjacent to the structure 204 to be filled.

Figure 8D:
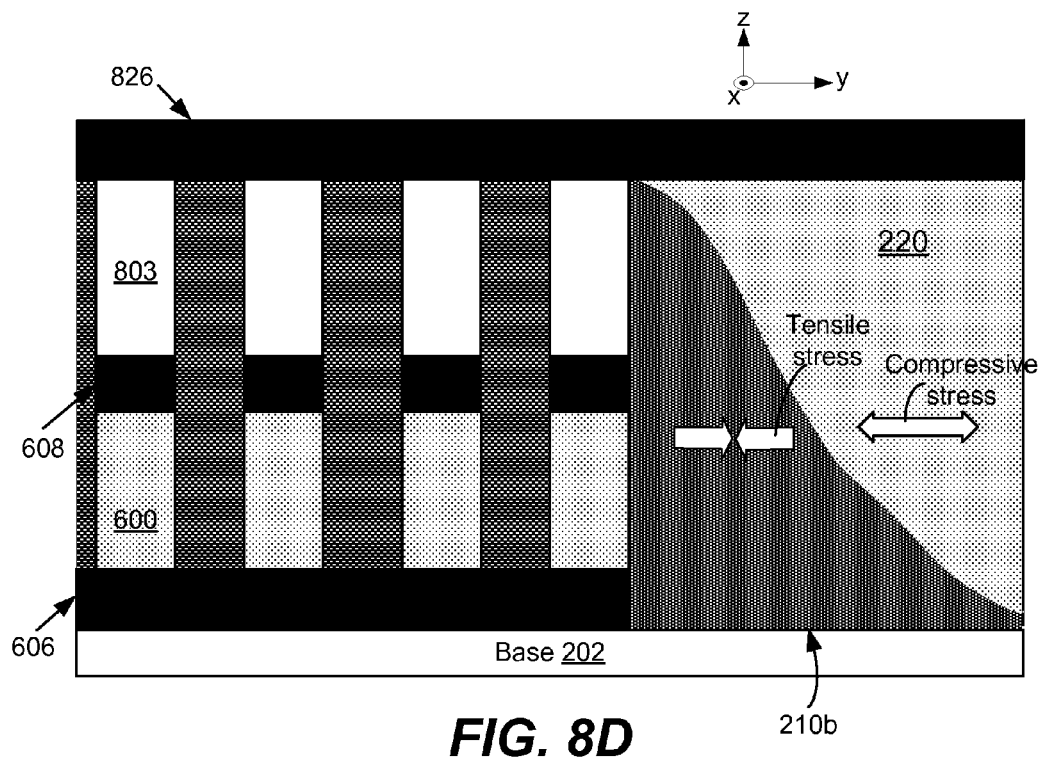

Next, steps 704-712 may be repeated to fill the structure with a flowable film 210, add a capping layer 220, cure the flowable film (e.g., convert to silicon oxide), and planarize the capping layer. Also, a conductive layer may be deposited. FIG. 8D depicts results after such additional steps. Note that the compressive stress of the capping layer 220 may counteract the tensile stress of the cured fill layer 210b. This may prevent a crack from forming in the base 202 as a result of a possible void in the structure. As previously noted, the tensile stress of the cured fill layer 210b can lead to a crack in the based 202 if there is a void in the structure 204.

Additional steps may be formed to form memory cells from regions 803 (which are lines at this point) and to form y-conductors from conductive layer 826. Thus, a structure such as the one depicted in FIG. 6C may be formed. Note that many other layers can be added to the top of that structure. When forming additional layers, the pattern of lines and gaps may be formed on a layer other than a substrate. For example, an additional memory cell layer may be formed on top of the structure of FIG. 8D (this may be prior to etching the top metal layer to form the top conductors 606). Then, the additional memory layer, conductive layer 826, and the memory lines 803 below that may be etched. This etch may create a dense pattern of lines and gaps. Note that the further up processing goes, the more damage may be done to the structure as a result of a crack. For example, many different layers of the 3D memory array could be damaged by a crack that is initiated when processing an upper layer. This crack may or may not reach all the way down to the substrate. However, by using techniques disclosed herein, a crack may be prevented.

One embodiment includes a method of forming features in a semiconductor device, which comprises the following. A structure having a pattern of lines and gaps is formed over a base that extends in a horizontal direction. The lines have top surfaces. The structure is adjacent to an open area over the base. A flowable film is formed to substantially fill the gaps in the structure and over the base in the open area adjacent to the structure. The flowable film has a top surface in the open area that is lower than the top surfaces of the lines. A dielectric film is formed over the flowable film. The dielectric film has compressive stress in the open area in the horizontal direction. The dielectric film has a bottom surface in the open area adjacent to the structure that is lower than the top surfaces of the lines. The flowable film is cured after forming the dielectric film. The curing increases tensile stress of the flowable film in the open area in the horizontal direction. The compressive stress of the dielectric film in the horizontal direction counteracts the tensile stress of the flowable film in the horizontal direction in the open area.

One embodiment includes a method of forming a 3D memory device, which comprises the following. A pattern of lines and gaps in a memory array portion the 3D memory device is formed. The lines have top surfaces. The pattern is adjacent to an open area outside of the memory array. A flowable film is formed to substantially fill the gaps in the pattern and over a base in the open area outside of the memory array. The flowable film has a top surface in the open area outside of the memory array that is lower than the top surfaces of the lines and has a top surface within the pattern to substantially fill the gaps to the top surfaces of the lines. A capping layer is formed over the flowable film. The capping layer has compressive stress in a horizontal direction in the open area. The capping layer has a lower surface outside of the pattern that is lower than the top surfaces of the lines. The flowable film is cured after forming the capping layer. Curing the flowable film increases tensile stress of the flowable film in the horizontal direction in the open area. The compressive stress of the capping layer in the horizontal direction counteracts the tensile stress of the cured flowable film in the horizontal direction in the open area. The capping layer is removed over the pattern while leaving portions of the capping layer in place over top of the flowable film in the open area outside of the memory array. A conductive layer for either word lines or bit lines is formed in electrical contact with the pattern of lines after removing the capping layer.

One embodiment includes a method of forming features in a semiconductor device, which comprises the following. A dense pattern of lines and gaps is formed over a substrate that has a surface that extends horizontally. The lines have top surfaces. The dense pattern is adjacent to an open area. The substrate extends in a horizontal direction. A flowable CVD oxide film is formed to substantially fill the gaps in the dense pattern and over the substrate in the open area adjacent to the dense pattern. The flowable CVD oxide film has a top surface in the open area adjacent to the dense pattern that is lower than the top surfaces of the lines and has a top surface within the lines to substantially fill the pattern to the top surfaces. The flowable CVD oxide film has a minimum thickness to fill the gaps in the dense pattern of lines and gaps. The flowable CVD oxide film slopes downward in a direction away from the dense pattern in the open area. A layer of silicon oxide is formed using PE-TEOS over the flowable CVD oxide film. The PE-TEOS is formed on the downward slope of the flowable CVD oxide film. The PE-TEOS layer of silicon oxide has compressive stress in the horizontal direction in the open area. The layer of silicon oxide has a lower surface outside of the dense pattern that is lower than the top surfaces of the lines.

The flowable CVD oxide film is converted to silicon oxide after forming the PE-TEOS layer of silicon oxide. Converting the flowable CVD oxide film causes the silicon oxide formed from the flowable CVD film to have tensile stress in the horizontal direction in the open area. The compressive stress of the PE-TEOS layer of silicon oxide in the horizontal direction substantially balances the tensile stress of the silicon oxide formed from the flowable CVD film that is in the horizontal direction in the open area.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications to thereby enable others skilled in the art to best utilize the various embodiments and with various modifications as are suited to the particular use contemplated. It is intended that the scope be defined by the claims appended hereto.

What is claimed is:

1. A method of forming features in a semiconductor device, the method comprising:
    forming a structure having a pattern of lines and gaps over a base that extends in a horizontal direction, the lines having top surfaces, the structure is adjacent to an open area over the base, wherein the forming a structure having a pattern of lines and gaps includes forming a memory cell of a 3D memory array;
    forming a flowable film to substantially fill the gaps in the structure and over the base in the open area adjacent to the structure, the flowable film having a top surface in the open area that is lower than the top surfaces of the lines;
    forming a dielectric film over the flowable film, the dielectric film having compressive stress in the horizontal direction in the open area, the dielectric film having a bottom surface in the open area adjacent to the structure that is lower than the top surfaces of the lines; and
    curing the flowable film after forming the dielectric film, the curing increases tensile stress of the flowable film in the horizontal direction in the open area, the compressive stress of the dielectric film in the horizontal direction in the open area counteracts the tensile stress of the flowable film in the horizontal direction in the open area.

2. The method of claim 1, wherein the dielectric film has a compressive stress of the dielectric film in the open area in the horizontal direction that substantially balances the tensile stress of the cured flowable film in the open area in the horizontal direction.

3. The method of claim 1, wherein the dielectric film has a compressive stress in the open area in the horizontal direction that counteracts the tensile stress of the cured flowable film in the open area in the horizontal direction to prevent a crack from forming in the base as a result of a void where the flowable film failed to fill a gap in the structure.

4. The method of claim 1, further comprising:
    removing the dielectric film over the structure while leaving portions of the dielectric film in place over the flowable film in the open area outside of the structure; and
    forming a conductive layer in electrical contact with the structure after removing the dielectric film.

5. The method of claim 1, wherein the forming a flowable film includes:
    forming the flowable film using CVD (Chemical Vapor Deposition).

6. The method of claim 1, wherein the forming a flowable film includes:
  forming a spin on dielectric (SOD) film.

7. The method of claim 1, wherein the forming a flowable film to fill the gaps in the structure includes:
  forming a film that has approximately a minimum thickness within the structure to reach the top surfaces of the structure.

8. The method of claim 1, wherein the forming a dielectric film over the flowable film comprises one or more of:
  forming a layer of silicon oxide using PE-CVD with tetra-ethylorthosilicate (TEOS) as a source;
  forming a silicon nitride layer using PE-CVD;
  forming a silicon oxide layer using PE-CVD; or
  forming a silicon oxide layer using HDP-CVD.

9. The method of claim 1, wherein the curing the flowable film includes:
  performing a high temperature steam anneal to convert the flowable film to silicon oxide.

10. The method of claim 1, wherein the curing the flowable film includes:
  curing with ultraviolet light.

11. The method of claim 1, wherein the flowable film slopes downward in the open area in a direction away from the structure, the dielectric film is formed on the downward slope of the flowable film.

12. A method of forming a 3D memory device, the method comprising:
  forming a pattern of lines and gaps in a memory array portion the 3D memory device, the lines having top surfaces, the pattern is adjacent to an open area outside of the memory array;
  forming a flowable film to substantially fill the gaps in the pattern and over a base in the open area outside of the memory array, the flowable film having a top surface in the open area outside of the memory array that is lower than the top surfaces of the lines and having a top surface within the pattern to substantially fill the gaps to the top surfaces of the lines;
  forming a capping layer over the flowable film, the capping layer having compressive stress in the open area in a horizontal direction, the capping layer having a lower surface outside of the pattern that is lower than the top surfaces of the lines;
  curing the flowable film after forming the capping layer, the curing increases tensile stress of the flowable film in the open area in the horizontal direction, the compressive stress of the capping layer in the horizontal direction counteracts the tensile stress of the cured flowable film in the horizontal direction;
  removing the capping layer over the pattern while leaving portions of the capping layer in place over top of the flowable film in the open area outside of the memory array; and
  forming a conductive layer for either word lines or bit lines in electrical contact with the pattern of lines after removing the capping layer.

13. The method of claim 12, wherein the compressive stress of the capping layer in the horizontal direction substantially balances the tensile stress of the cured flowable film in the horizontal direction in the open area outside of the memory array.

14. The method of claim 12, wherein the forming a capping layer over the flowable film comprises one or more of:
  forming a layer of silicon oxide using PE-CVD with tetra-ethylorthosilicate (TEOS) as a source;
  forming a silicon nitride layer using PE-CVD;
  forming a silicon oxide layer using PE-CVD; or
  forming a silicon oxide layer using HDP-CVD.

15. The method of claim 12, wherein the forming a pattern of lines and gaps in a memory array portion the 3D memory device includes:
  forming lines for conductors and memory cells, a single one of the lines will be used for a first of the conductors and a plurality of the memory cells.

16. The method of claim 12, further comprising:
  forming a layer for memory cells above the conductive layer for either word lines or bit lines; and
  patterning the layer for memory cells and the conductive layer for either word lines or bit lines to form a second pattern of lines and gaps.

17. The method of claim 16, further comprising:
  forming a second flowable film to substantially fill the gaps in the second pattern and over a base in the open area outside of the memory array, the flowable film having a top surface in the open area outside of the memory array that is lower than the top surfaces of the lines and having a top surface within the pattern to substantially fill the gaps to the top surfaces of the lines;
  forming a second capping layer over the flowable film, the second capping layer having compressive stress in a horizontal direction in the open area, the second capping layer having a lower surface outside of the second pattern that is lower than the top surfaces of the lines;
  curing the second flowable film after forming the capping layer, the curing increases tensile stress of the flowable film in the horizontal direction in the open area, the compressive stress of the capping layer in the horizontal direction counteracts the tensile stress of the flowable film in the horizontal direction in the open area.

18. A method of forming features in a semiconductor device, the method comprising:
  forming a dense pattern of lines and gaps over a substrate that has a surface that extends horizontally, the lines having top surfaces, the dense pattern is adjacent to an open area, the substrate extends in a horizontal direction, wherein the forming a dense pattern of lines and gaps includes forming a memory cell of a 3D memory array;
  forming a flowable CVD oxide film to substantially fill the gaps in the dense pattern and over the substrate in the open area adjacent to the dense pattern, the flowable CVD oxide film having a top surface in the open area adjacent to the dense pattern that is lower than the top surfaces of the lines and having a top surface within the lines to substantially fill the pattern to the top surfaces, the flowable CVD oxide film having a minimum thickness to fill the gaps in the dense pattern of lines and gaps, the flowable CVD oxide film slopes downward in the open area in a direction away from the dense pattern;
  forming a layer of silicon oxide using PE-TEOS over the flowable CVD oxide film, the PE-TEOS formed on the downward slope of the flowable CVD oxide film, the PE-TEOS layer of silicon oxide having compressive stress in the open area the horizontal direction, the layer of silicon oxide having a lower surface outside of the dense pattern that is lower than the top surfaces of the lines; and
  converting the flowable CVD oxide film to silicon oxide after forming the PE-TEOS layer of silicon oxide, the converting causes the silicon oxide formed from the flowable CVD film to have tensile stress in the open area in the horizontal direction, the compressive stress of the PE-TEOS layer of silicon oxide in the open area in the horizontal direction substantially balances the tensile stress of the silicon oxide in the open area formed from the flowable CVD film that is in the horizontal direction.

19. The method of claim 18, wherein the dense pattern of lines and gaps has a void where the flowable CVD oxide film failed to fill a gap in the dense pattern, the compressive stress in the open area in the horizontal direction substantially balances the tensile stress in the open area that is in the horizontal direction to prevent a crack from forming in the substrate.

20. The method of claim 18, wherein the flowable CVD oxide film includes silicon, nitrogen, and hydrogen.

21. The method of claim 18, wherein the converting the flowable CVD oxide film to silicon oxide after forming the PE-TEOS layer of silicon oxide includes performing a steam anneal.

* * * * *